US006887026B1

United States Patent
Kübart

(10) Patent No.: US 6,887,026 B1
(45) Date of Patent: May 3, 2005

(54) SEMICONDUCTOR PRODUCT CONTAINER AND SYSTEM FOR HANDLING A SEMICONDUCTOR PRODUCT CONTAINER

(75) Inventor: Gregor Kübart, Dresden (DE)

(73) Assignee: Infineon Technologie SC300 GmbH & Co. KG, Dresden (DE)

( * ) Notice: Subject to any disclaimer, the term of this patent is extended or adjusted under 35 U.S.C. 154(b) by 0 days.

(21) Appl. No.: 10/601,639

(22) Filed: Jun. 23, 2003

Related U.S. Application Data

(63) Continuation of application No. PCT/EP01/11844, filed on Oct. 12, 2001.

(30) Foreign Application Priority Data

Dec. 22, 2000 (EP) .............................................. 00128434

(51) Int. Cl.$^7$ ................................................ B65G 1/00
(52) U.S. Cl. ........................ 414/217; 414/936; 414/940
(58) Field of Search ................................ 414/217, 940, 414/936

(56) References Cited

U.S. PATENT DOCUMENTS

| 5,980,183 A | | 11/1999 | Fosnight ................ 414/222.01 |
| 6,050,768 A | * | 4/2000 | Iwasaki et al. ........ 414/222.01 |
| 6,060,992 A | * | 5/2000 | Huang et al. ................ 340/674 |
| 6,591,160 B2 | * | 7/2003 | Hine et al. ................... 700/218 |
| 6,591,162 B1 | * | 7/2003 | Martin ....................... 700/228 |

FOREIGN PATENT DOCUMENTS

| EP | 0 412 945 A1 | 2/1991 |
| JP | 57115831 | 7/1982 |
| JP | 63229810 | 9/1988 |
| JP | 05238513 | 9/1993 |
| JP | 06216216 | 8/1994 |
| JP | 2000269302 | 9/2000 |
| WO | 00/33355 | 6/2000 |

* cited by examiner

Primary Examiner—Eileen D. Lillis
Assistant Examiner—Michael Lowe
(74) Attorney, Agent, or Firm—Laurence A. Greenberg; Werner H. Stemer; Ralph E. Locher

(57) ABSTRACT

A system for handling a semiconductor product container contains a handler for transporting and positioning the container. A loading/unloading position requires first support members forming part of a loading/unloading device engaging with second support members forming part of the container. The system contains a detector for detecting reference point positions of the container and a localization device for computing the position of the container from the detected reference point positions, and allows for handling the containers without the need of mounting any support pins on each storage location.

18 Claims, 2 Drawing Sheets

FIG 1
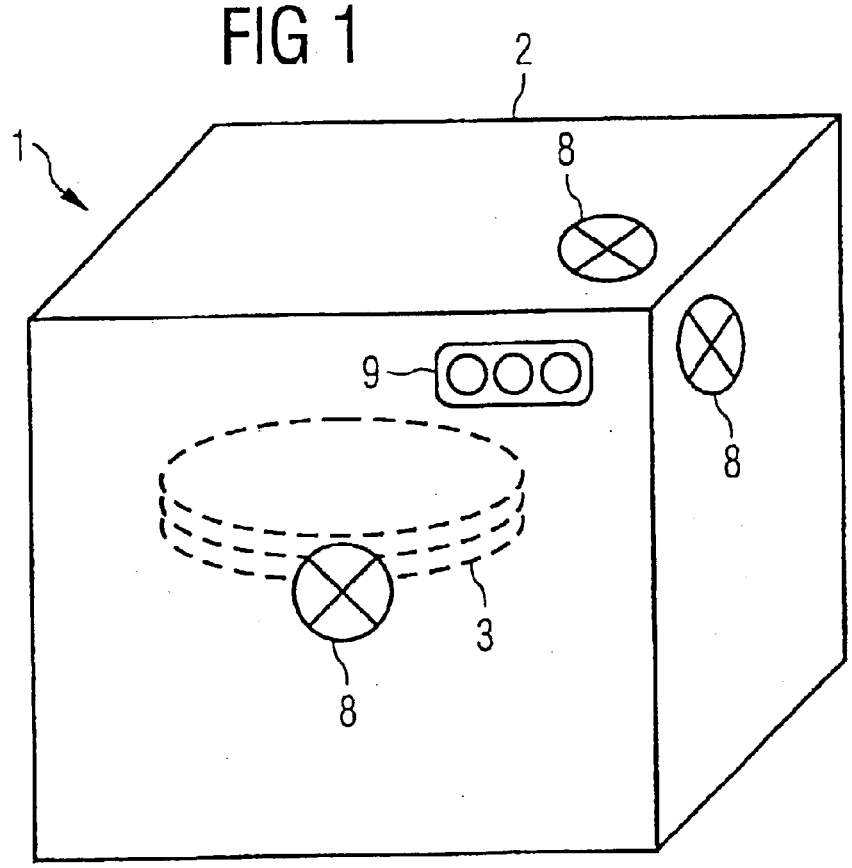
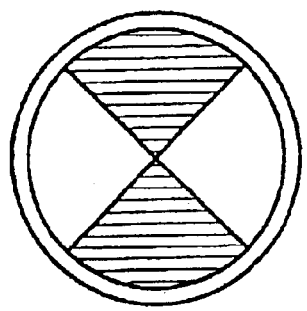
FIG 2A
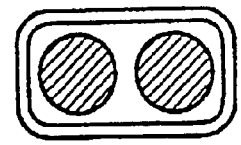
FIG 2B
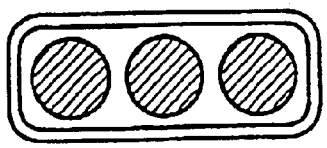
FIG 2C

SEMICONDUCTOR PRODUCT CONTAINER AND SYSTEM FOR HANDLING A SEMICONDUCTOR PRODUCT CONTAINER

CROSS-REFERENCE TO RELATED APPLICATION

This application is a continuation of copending International Application No. PCT/EP01/11844, filed Oct. 12, 2001, which designated the United States and was published in English.

BACKGROUND OF THE INVENTION

Field of the Invention

The present invention refers to a container for the storage and/or the transport of at least one semiconductor product. The container contains a housing with a support region supporting the housing when standing on an essentially even ground, a load/unload region for loading and/or unloading the semiconductor product, and a cover region enclosing the semiconductor product from at least two directions. The housing contains second support members positioned at predefined positions of the housing that are engageable with first support members forming part of the semiconductor product loading/unloading device.

The invention further relates to a system for handling a semiconductor product container. The system contains a handler for transporting the container between a loading/unloading position of a semiconductor product loading/unloading device and positions at other locations and for positioning in the container in the loading/unloading position. The loading/unloading position is such that first support members forming part of the loading/unloading device engage with second support members forming part of the container.

In the semiconductor industry wafers are transported in front-opening unified pods (FOUPs) between loadports connected to different processing or measuring tools. The FOUPs accommodate several wafers in a mini-environmental atmosphere of high purity. Once enclosed by the FOUP, the wafers can be transported within a cleanroom of less purity by operating personnel. The FOUP can be coupled with a loadport enclosing a mini-environmental atmosphere, too.

Semiconductor handling requires highly precise positioning of both the FOUP and the semiconductor wafers. Therefore, each loadport contains three cinematic pins supporting the FOUP when coupled to the loadport. These pins engage in grooves allocated at the bottom side of the FOUP, thereby granting exact positioning of the FOUP on the loadport. Deviations from exact positioning may lead to semiconductor wafer destruction by handling or to leakage of the outer cleanroom atmosphere into the mini-environmental atmosphere.

In order to grant highly precise positioning of the FOUPs, each location intermediately supporting any FOUP contains pins disposed in the same manner as the cinematic coupling pins of the loadports. These pins are allocated at predefined positions at all storage locations, thereby characterising predefined FOUP storage positions. Any system used for handling has software storage for storing the predefined FOUP storage positions at the other locations.

This kind of handling is very disadvantageous and inconvenient. First, each location—even a simple shelf serving as an even support surface—has to be equipped with multitudes of support pins. Furthermore, any of such locations are very restricted with view to possible FOUP positions thereon. Depending on geometry of the FOUPs and/or the storage locations, continuously variable SOUP storage positions may be desirable.

Second, any misalignment of the FOUP relative to the support pins may lead to improper handling of the FOUP and, as a consequence, improper positioning of the FOUP at the loadport. Hence, there is a risk of wafer destruction adherent to prior art FOUP handling systems.

SUMMARY OF THE INVENTION

It is accordingly an object of the invention to provide a semiconductor product container and a system for handling the semiconductor product container that overcomes the above-mentioned disadvantages of the prior art devices of this general type, which allows for proper semiconductor product container handling even in the case of deviations of actual container positions at any other location relative to their predefined positions and/or in case of non-predefined container positions. Any actual container position shall allow for highly precise container positioning when it is transported to a container loading/unloading device like a loadport.

With the foregoing and other objects in view there is provided, in accordance with the invention, a container for at least one of storing and transporting at least one semiconductor product. The container includes a housing, containing a support region supporting the housing when standing on substantially even ground, a load/unload region for loading and/or unloading the semiconductor product, a cover region enclosing the semiconductor product from at least two directions, and second support members positioned at predefined positions of the housing and engageable with first support members forming part of a loadport to which the housing is couplable to. Marking elements marking reference points of the container are disposed on the housing. The reference points have predefined positions relative to the second support members.

With view to the container, according to the invention the object is achieved by the container having marking elements that mark reference points of the container. The reference points having predefined positions relative to the second support members.

With view to the system, the object of the invention is achieved by the system containing a detector for detecting reference point positions of the container and a localization device for computing the position of the container from the detected reference point positions. The detector and the localization device control the system to position the container in the loading/unloading position if actual positions at the other locations deviate from predefined positions stored by the system and/or if actual positions at the other locations are non-predefined with view to at least one direction or orientation.

The following idea underlies the invention.

The essential portion of the FOUP granting its exact positioning at the loadport is its triple of grooves allocated beneath the bottom surface of the FOUP. Three cinematic coupling pins of any loadport engage in these grooves. However, when transporting the FOUP from or to the loadport, these grooves are not accessible by the handler because they are facing the loadport table and are supported by the pins. Hence, according to prior art, the only way of detecting the actual position of the grooves and, as a consequence, of the FOUP, was to provide each other FOUP support location with copies of these triple of pins at predefined positions corresponding to predefined stepwise transport motion. In this way, proper support of FOUPs on any one of these triples of pins was necessary.

According to the present invention, marking elements allocated at those sides of the FOUP visible and/or accessible by the handler are employed to indirectly define the position of the grooves of the FOUP.

According to the invention, the marking elements are marking reference points that have predefined positions relative to the grooves.

With view to the container according to the invention, the marking elements preferably are provided at at least two surfaces, more preferably at three surfaces of the container. Detecting positions of three marking elements allows for unequivocal definition of container position. However, depending on the geometry of other container support locations, less than three marking elements may be sufficient.

The marking elements are three-dimensional markings or, more preferably with view to posterior marking of existing containers, optical markings. In particular, the optical markings may be contrast markings containing black and white or dark and bright regions of marking labels that may be attached to surfaces of FOUP containing reference points.

Preferably, the optical markings are reflective. In any case, these markings may be produced as labels attachable to the housing of any existing FOUP. Thereby, any FOUP can be made capable of being transported according to the present invention.

Preferably, an optical marking is identifying one respective reference point in two dimensions. However, depending on the detector for identifying reference point positions, even the location of a reference point perpendicular to the respective surface of the container may be identified.

Preferably, the container contains further optical markings identifying one of a front-side, a side, a rear-side or topside of the container. For instance, the additional markings may characterize each surface by a symbol or a certain number of unified symbols.

Preferably, the support members of the container for positioning it on a loading/unloading device are connected to the support region supporting the housing of the container when standing on an essentially even ground. More preferably, the support members are grooves allocated beneath the bottom side of the container. Most preferably, the container is a front-opening unified pod (FOUP).

The containers as described above may be handled by a system according to the present invention. A detector of the system detects reference point positions identified by the above marking elements, and the localization device computes a position of the container from the detected reference point positions. By detecting reference point positions and localizing the container position, that is the position of its support members, the system is enabled to position the container in the loading/unloading position even in case that an actual position of the container supported at another location than a loading/unloading device deviates from a predefined position or in case that the actual position of the container on another location is non-predefined, that is variable, with view to at least one direction or orientation by reasons of geometry of the location. For instance, if containers are located on a shelf, the lateral position may be varied continuously and, in case of a shelf inclined laterally, may depend on the number of other containers already resting of the shelf.

Preferably, the detector is attached to a movable handler. According to this embodiment, the handler is enabled to define their position relative to the position of a container to be grabbed and transported to the loading/unloading device.

Preferably, the detector contains an optical camera which, of course, may be equipped with modern CCD-chips or other advanced digital imaging processing.

Preferably, a comparative position of the handler relative to a position of the container is computed. With this comparative position, the handler can be moved from this position to a predefined position relative to the container, the predefined position being suitable to grab the container for transporting it to the loading/unloading device and then positioning it on the cinematic coupling pins.

Other features which are considered as characteristic for the invention are set forth in the appended claims.

Although the invention is illustrated and described herein as embodied in a semiconductor product container and a system for handling the semiconductor product container, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, front-right-top side perspective view of a FOUP according to the invention;

FIGS. 2A–2C are illustrative examples of marking elements;

DESCRIPTION OF THE PREFERRED EMBODIMENTS

Figure 3:
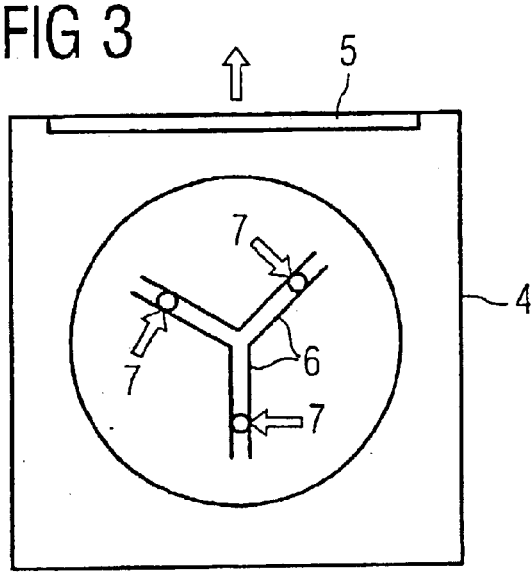
FIG. 3 is a bottom, plan view of the FOUP in detail.

Referring now to the figures of the drawing in detail and first, particularly, to FIG. 1 thereof, there is shown a FOUP seen from front-right-top side perspective view. The actual, rather complex shape of a FOUP will be familiar to those skilled in the art. The FOUP accommodates a number of semiconductor wafers indicated by dashed lines with reference number 3 in its housing 2. The three surfaces illustrated as well as the left and back-side form a cover region enclosing the semiconductor product from at least two directions. Furthermore, the container contains a support region illustrated in detail in FIG. 3.

In FIG. 1, each surface has a marking element 8 for marking one respective reference point of the surface. In addition, there may be provided markings 9 for indicating what kind of side of the container is facing the system for handling the container according to the present invention.

FIG. 2A shows a marking element for marking one reference point position. It is an optical contrast marking and is formed of a circle surrounding four-quarter contrast regions, the regions of equal brightness being located opposed to each other with respect to the center of the circle.

In FIGS. 2B and 2C, additional markings for characterizing the kind of the surface regarded are proposed for example.

In FIG. 3, the bottom side of the FOUP is shown from beneath. The whole bottom plane serves to support the housing of the FOUP when standing on an essentially even ground like a shelf. In addition, in an inner circular region three grooves 6 to engage with cinematic coupling pins 7 indicated by arrows are illustrated. Engagement of members 6 and 7 grants a highly precise docking of the FOUP to a non-illustrated loadport.

Reference numeral 5 indicates the load/unload region for loading and/or unloading the semiconductor products, the arrow above indicating the direction in which the FOUP is coupled to the loadport.

Figure 4:
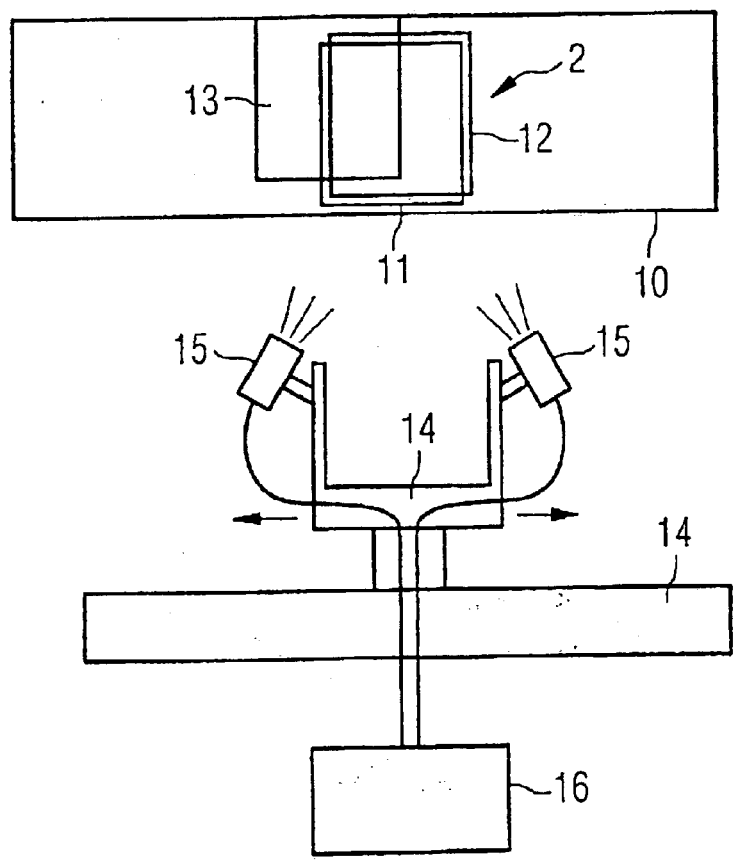
FIG. 4 is a schematic illustration of a function of a system according to the invention.

FIG. 4 illustrates the system according to the present invention and its function. It is constructed to handle containers 1 at any positions on other storage locations like shelves 10, for instance. Apart from predefined container positions 11 allowing transport according to prior art, the system according to the present invention allows for transport even in case of minor deviations of an actual position 12 from the predefined position 11 as well as in case of non-predefined, that is continuously variable positions 13.

The system contains a handler or handling device 14 for transporting the container 1 between a loading device and other locations. According to the invention, the system contains a detector or detection device 15 which preferably are optical cameras. The detector 15 detects a position of the marking elements and is connected to a localization device 16 for computing the position of the container 1 from the detected reference point positions. Preferably, the localization device 16 computes the position of the grooves 6, especially of their points of engagement with the coupling pins 7 illustrated in FIG. 3. The handling device 14 and the detection device 15 are then controlled to move in a position appropriate for approaching the container and grabbing it.

As a result of the present invention, a database for storing all FOUP support positions of storing locations is no longer required. Instead, the automated system according to the invention can derive the relative position of the FOUP to its own location and pick up the FOUP from any location in a controlled manner. The marking elements according to the present invention may be combined with barcode labels for FOUP identification, and for their recognition the same optical devices may be employed. Preferably, the handling device 14 may be moved to a position comparative to the position of the FOUP corresponding to a certain direction given by the actual orientation of the FOUP. In this way, any positioned FOUP may be grabbed from a certain direction as required in modern wafer handling especially for 300 mm carriers. Details of grippers, handling arms, robotics and so on will be apparent to those skilled in the art. Apart from atmospherically isolating FOUPs, also open cassettes for smaller wafer sizes can be handled according to the invention.

I claim:

1. A container for at least one of storing and transporting at least one semiconductor product, the container comprising:
   a housing, containing:
      a support region supporting said housing when standing on substantially even ground;
      a load/unload region for loading and/or unloading the semiconductor product;
      a cover region enclosing the semiconductor product from at least two directions; and
      second support members positioned at predefined positions of said housing and engageable with first support members forming part of a loadport to which said housing is couplable to; and
   marking elements marking reference points of the container and disposed on said housing, said reference points having predefined positions relative to said second support members, said marking elements each identifying a reference point in two directions.

2. The container according to claim 1, wherein said housing has surfaces and said marking elements are disposed on at least two of said surfaces.

3. The container according to claim 2, wherein said housing has surfaces and said marking elements are disposed on at least three of said surfaces.

4. The container according to claim 1, wherein said marking elements are three-dimensional markings.

5. The container according to claim 1, wherein said marking elements are optical markings.

6. The container according to claim 5, wherein said optical markings are contrast markings.

7. The container according to claim 1, wherein said marking elements are reflective.

8. The container according to claim 5, wherein said optical markings are labels attached to said housing.

9. The container according to claim 1, further comprising further optical markings identifying a front-side, a side, a rear-side or a top-side of said housing.

10. The container according to claim 1, wherein said second support members are connected to said support region.

11. The container according to claim 1, wherein said housing has grooves formed therein and said second support members are said grooves.

12. The container according to claim 1, wherein said housing forms a front-opening unified pod.

13. A system for handling a container for semiconductor products, the system comprising:
   a handler for transporting the container between a loading/unloading position of a loadport to which the container is couplable to, to positions at other locations, and for positioning the container in an loading/unloading position, the loading/unloading position being such that first support members forming part of the loadport engage with second support members forming part of the container;
   a detector for detecting reference point positions of the container; and
   a localization device for computing a position of the container from detected reference point positions, said detector and said localization device control a positioning of the container in the loading/unloading position, if actual positions of the container deviate from predefined positions stored by the system and/or if the actual positions at other locations are non-predefined with a view to at least one direction or orientation.

14. The system according to claim 13, wherein said detector is attached to said handler being a movable handler.

15. The system according to claim 13, wherein said detector includes an optical camera.

16. The system according to claim 13, wherein said localization device computes a comparative position of said handler relative to a position of the container.

17. The system according to claim 16, wherein said handler is controllable to move from the comparative position to a position predefined relative to the container and suitable for grabbing the container.

18. The system according to claim 13, wherein the system is constructed to transport and position containers of the kind according to claim 1.

* * * * *

UNITED STATES PATENT AND TRADEMARK OFFICE
CERTIFICATE OF CORRECTION

PATENT NO.     : 6,887,026 B1
DATED          : May 3, 2005
INVENTOR(S)    : Gregor Kübart It is certified that error appears in the above-identified patent and that said Letters Patent is hereby corrected as shown below:

<u>Title page,</u>
Item [73], Assignee, should read as follows:
-- Infineon Techonlogies SC300 GmbH & Co. KG, Dresden (DE) --

Signed and Sealed this

Twelfth Day of July, 2005

JON W. DUDAS
*Director of the United States Patent and Trademark Office*